(12) United States Patent
Mourant et al.

(10) Patent No.: US 6,313,712 B1
(45) Date of Patent: Nov. 6, 2001

(54) LOW POWER CRYSTAL OSCILLATOR HAVING IMPROVED LONG TERM AND SHORT TERM STABILITY

(75) Inventors: Jean-Marc Mourant, Groton; Daniel Shkap, Cambridge, both of MA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/592,704

(22) Filed: Jun. 13, 2000

(51) Int. Cl.$^7$ ....................................... H03B 5/36
(52) U.S. Cl. ................ 331/116 FE; 331/116 R; 331/158
(58) Field of Search .......................... 331/116 R, 116 FE, 331/158

(56) References Cited

U.S. PATENT DOCUMENTS

| | | | |
|---|---|---|---|
| 5,142,696 | 8/1992 | Kosiec et al. | 455/260 |
| 5,162,668 | 11/1992 | Chen et al. | 307/296.8 |
| 5,239,274 | 8/1993 | Chi | 331/57 |
| 5,247,581 | 9/1993 | Gurcan | 381/68.4 |
| 5,325,268 | 6/1994 | Nachnani et al. | 361/767 |
| 5,359,301 | 10/1994 | Candage | 331/57 |
| 5,362,990 | 11/1994 | Alvarez et al. | 327/538 |
| 5,418,497 | 5/1995 | Martin | 331/48 |
| 5,438,300 | 8/1995 | Saban et al. | 331/16 |
| 5,553,100 | 9/1996 | Saban et al. | 375/340 |
| 5,554,958 | 9/1996 | Donoghue | 330/149 |
| 5,557,224 | 9/1996 | Wright et al. | 327/115 |
| 5,578,970 | 11/1996 | Nguyen et al. | 331/75 |
| 5,592,515 | 1/1997 | Saban et al. | 375/340 |
| 5,621,755 | 4/1997 | Bella et al. | 375/219 |
| 5,629,648 | 5/1997 | Pratt | 330/289 |
| 5,666,388 | 9/1997 | Neron | 375/376 |
| 5,694,305 | 12/1997 | King et al. | 363/19 |
| 5,734,285 | 3/1998 | Harvey | 327/291 |
| 5,734,976 | 3/1998 | Bartschi et al. | 455/333 |
| 5,736,880 | 4/1998 | Bruccoleri et al. | 327/157 |
| 5,740,115 | 4/1998 | Ishibashi et al. | 365/203 |
| 5,808,494 | 9/1998 | Chang et al. | 327/115 |
| 5,811,998 | 9/1998 | Lundberg et al. | 327/156 |
| 5,828,620 | 10/1998 | Foss et al. | 365/226 |
| 5,847,621 | 12/1998 | Gutierrez | 331/117 R |
| 5,878,358 | 3/1999 | Parsons et al. | 701/1 |
| 5,912,552 | 6/1999 | Tateishi | 323/285 |
| 5,920,810 | 7/1999 | Finol et al. | 455/313 |
| 5,929,712 | 7/1999 | Kuriyama | 331/25 |
| 5,930,197 | 7/1999 | Ishibashi et al. | 365/233 |
| 5,963,094 | 10/1999 | Linder et al. | 330/264 |
| 5,982,108 | 11/1999 | Buij et al. | 315/209 |
| 6,028,491 | * 2/2000 | Stanchak et al. | |

* cited by examiner

Primary Examiner—Siegfried H. Grimm
(74) Attorney, Agent, or Firm—Connoly Bove Lodge & Hutz

(57) ABSTRACT

An oscillator circuit having improved long term and short term phase stability. A source follower provides a signal to a bipolar transistor. The bipolar transistor is fed with a current from a current mirror which may be selectively controlled. A piezoelectric crystal and a high resistance element are connected in parallel from the collector of the bipolar transistor to the input of the source follower. The drive voltage to the piezoelectric crystal is controlled by the current mirror to improve long term frequency stability.

10 Claims, 1 Drawing Sheet

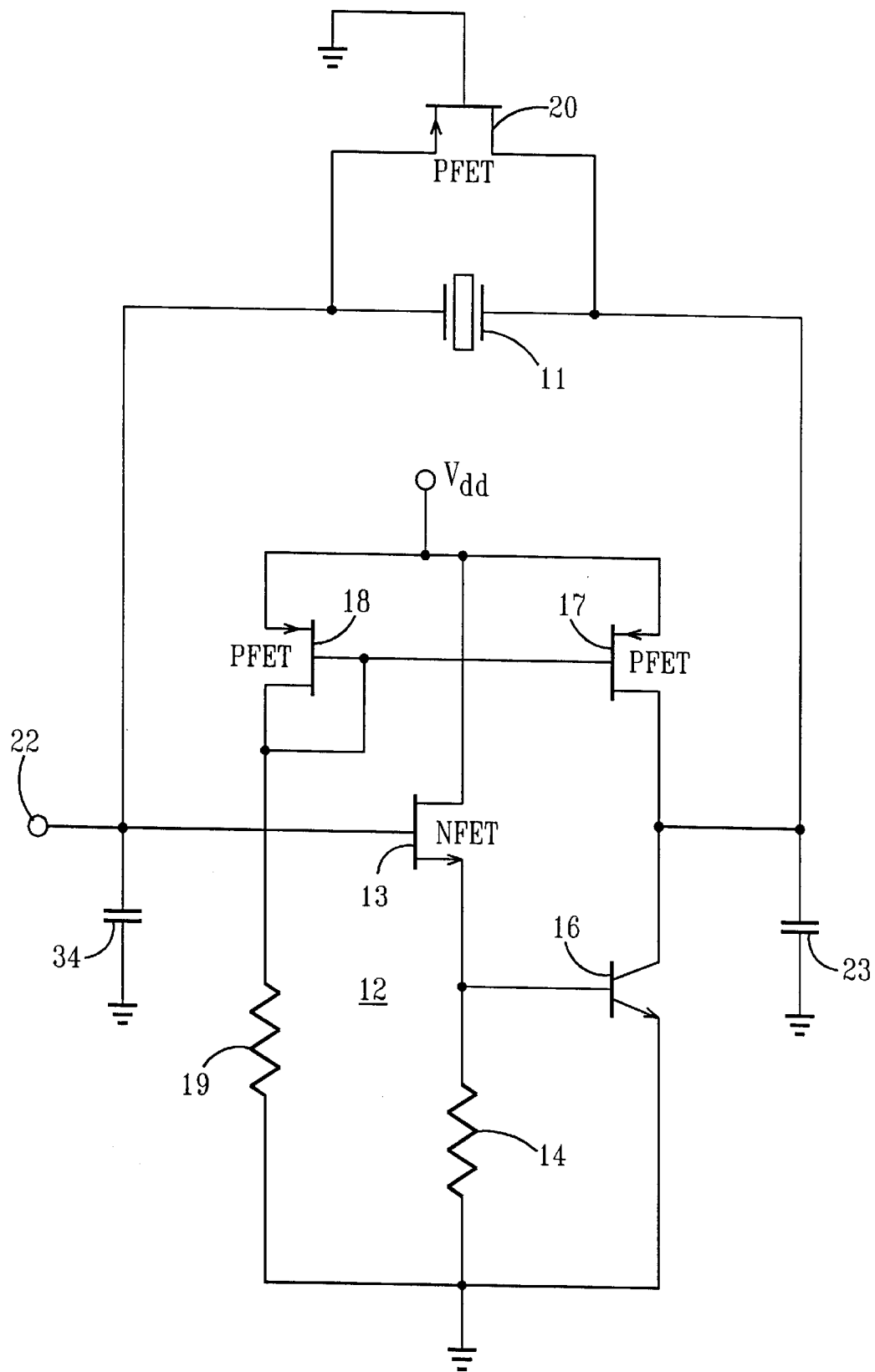

LOW POWER CRYSTAL OSCILLATOR HAVING IMPROVED LONG TERM AND SHORT TERM STABILITY

BACKGROUND OF THE INVENTION

The present invention relates to oscillators which generate radio frequency signals. Specifically, a crystal oscillator for low power applications is described having improved long term and short term frequency stability.

Crystal oscillators have been used for many years as the signal generators for generating frequency stable radio frequency signals. The proliferation of low power communication devices, such as cellular telephones, has placed additional constraints on oscillator design since a major objective of the design is to preserve battery life. In applications such as the cellular telephones, a frequency synthesizer may typically be used to generate a local oscillator signal for the superhetrodyne receiver within the telephone. The frequency synthesizer as is well known relies upon a stable source of radio frequency signals from which to synthesize other signals needed in the frequency conversion process for the telephone receiver. The source of radio frequency signals must have good long term stability, i.e., the frequency drift must be within a tolerable range, as well as a high short term stability constituting the noise floor for the radio frequency signal.

SUMMARY OF THE INVENTION

An oscillator circuit is provided having a high long term frequency stability as well as short term frequency stability in a low power radio frequency generator. The oscillator circuit achieves long term stability by maintaining a low amplitude drive signal across a frequency control element to lower the power dissipation in the frequency control element. The oscillator circuit has few active elements which would otherwise reduce the oscillator's short term stability.

In a preferred embodiment of the invention, a source follower is connected to drive a bipolar transistor. Feedback is provided through a frequency control element connected between the bipolar transistor collector-emitter circuit and the source follower input. The current level through the bipolar transistor is established by a current source which sets the drive voltage for the frequency control element. An output terminal is connected to the source follower input which produces a radio frequency signal having lower distortion and consequently a reduced amount of phase noise.

DESCRIPTION OF THE FIGURES

FIG. 1 is a schematic drawing of a preferred embodiment of the invention.

DETAILED DESCRIPTION OF THE PREFERRED EMBODIMENT

Referring now to FIG. 1, an oscillator for producing radio frequency signals is shown. The oscillator includes a frequency control element which may be a piezoelectric crystal 11 along with the stabilizing capacitors 23 and 24 connected in a Pierce type oscillator circuit, to achieve the objectives of the present invention.

A source follower circuit 12 has an output connected to the base of an NPN bipolar transistor 16. NPN bipolar transistor 16 is connected in a common emitter mode which provides an amplified voltage across the collector emitter of NPN transistor 16. The piezoelectric crystal 11 is in parallel with feedback resistor 20, and connects the collector of NPN transistor 16 to the input of source follower circuit 12.

The long term stability for the oscillator of FIG. 1 is maintained by minimizing the drive, i.e., signal level applied across the frequency control element 11. The lowered drive signal is achieved by controlling current through NPN transistor 16 to a level which produces only the required voltage swing for driving the frequency determining element 11.

Control over the current through NPN transistor 16 is provided by a current source derived from a current mirror circuit. The current mirror circuit comprises PFET transistors 17 and 18, as well as a resistor 19. Resistor 19 and PFET 18 establish a reference current for the current mirror from the supply voltage Vdd. Because of the common gate-source voltage of PFETs 17 and 18, PFET 17 produces a current which flows through the collector emitter circuit of NPN transistor 16 which is directly controlled by the current through transistor 18. Thus, by adjusting the value of resistor 19 and the relative aspect ratio of PFETs 17 and 18, it is possible to control the current through the collector-emitter circuit of NPN transistor 16 and control the corresponding voltage swing across the collector emitter circuit.

The PFET 20 serves as a large value feedback resistor which provides a DC bias path without affecting the frequency of operation for the circuit, and maintains the input voltage to the source follower of gate 13a of transistor 13 at substantially the same potential as the voltage established on the collector of NPN transistor 16.

The short term stability of the oscillator circuit is a measure of the circuit phase noise. Phase noise is primarily determined by 1/F is noise, shot noise and thermal noise. The 1/F noise is minimized by increasing the area (width and length) of transistors PFETs 17, 18, and NFET 13. In addition, minimization of phase noise is achieved by maintaining the number of components to a minimum. The circuit is self-biased reducing the coupling to other circuit lines such as band gap elements, thereby further minimizing phase noise. Shot noise is determined by the amount of current through the collector emitter circuit of NPN transistor 16. Thermal noise is minimized by setting the appropriate current levels through all branches of the circuit.

A d.c. voltage level is set on the collector of transistor 16 such that the negative collector voltage swing is never less than the base voltage, preventing saturation of transistor 16. Feedback resistor 20 substantially equalizes the voltage on the collector of transistor 16 with the gate voltage on transistor 13. The gate voltage on transistor 13 is a function of the gate to source voltage and the voltage drop across resistor 14. The voltage drop across resistor 14 is the base emitter voltage of transistor 16. The gate to source voltage is determined by the transistor 13 aspect ratio and the drain to source current. The drain to source current is in turn determined by the value of resistor 14.

The output for the circuit is taken from a terminal 22 which is connected to the input of the source follower 12. The distortion of the signal at the input of source follower 12 is lower than the distortion of the voltage at the collector of NPN transistor 16, leading to even better phase noise performance.

To guarantee the oscillation start up in the circuit, the total gain provided by the source follower 12 and bipolar NPN transistor 16 is such that the total loop gain is 12 db or greater at the frequency of interest. This insures operation in all temperatures and process variations which occur during integrated circuit manufacture. The Pierce oscillator also requires stabilizing capacitors 23, 24 which are selected so that the total loop phase shift of 360° is obtained to maintain oscillation.

The foregoing description of the invention illustrates and describes the present invention. Additionally, the disclosure shows and describes only the preferred embodiments of the invention, but as aforementioned, it is to be understood that the invention is capable of use in various other combinations, modifications, and environments and is capable of changes or modifications within the scope of the inventive concept as expressed herein, commensurate with the above teachings, and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

What is claimed is:

1. An oscillator circuit comprising:
    source follower circuit having an input, and an output providing a source of low impedance current;
    a current source,
    a bipolar transistor having a base connected to said source follower output, and a collector-emitter circuit serially connected to said current source for passing a current from said current source;
    feedback means for supplying a d.c. voltage to said source follower input from said bipolar transistor; and
    a frequency control element connected between said bipolar transistor collector and said source follower input which establishes a loop gain and phase for producing oscillations which are amplitude controlled by a current level set by said current source.

2. The oscillator circuit according to claim 1 wherein said frequency control element includes a piezoelectric crystal.

3. The oscillator circuit according to claim 1 further comprising an output terminal connected to said source follower input.

4. The oscillator circuit according to claim 1 wherein said feedback means comprises a resistive element connected from said bipolar transistor collector to said source follower input.

5. The oscillator circuit according to claim 1 wherein a d.c. voltage level on said bipolar transistor collector is set to prevent said bipolar transistor from saturating during low voltage swings on said bipolar transistor collector.

6. The oscillator circuit according to claim 4 wherein said resistive element is an FET transistor.

7. An oscillator circuit having a controlled amplitude comprising:
    a source follower having an FET transistor serially connected with a resistor element;
    a current mirror having a first FET transistor having a drain and source serially connected with a resistor for setting a reference current, and having a second FET transistor having a gate connection connected to a gate connection of said first FET transistor for establishing a current which is dependent on said reference current;
    a bipolar transistor having a collector and emitter connected in series with said second FET transistor, and a base connection connected to said source follower output;
    a high resistance circuit element connecting said bipolar transistor collector to said source follower FET transistor gate for providing a d.c. voltage to said source follower; and
    a frequency determining element connected between said collector of said bipolar transistor and source follower FET transistor gate, whereby oscillations are produced at said bipolar transistor collector having an amplitude controlled by said current mirror.

8. The oscillator circuit according to claim 7 wherein said high resistance circuit element is an FET transistor.

9. The oscillator circuit according to claim 7 wherein said frequency determining element includes a piezoelectric crystal element.

10. The oscillator circuit according to claim 7 further comprising an output terminal connected to said source follower input.

* * * * *